(12) United States Patent
Herner et al.

(10) Patent No.: US 9,196,792 B2
(45) Date of Patent: Nov. 24, 2015

(54) NANOWIRE LED STRUCTURE WITH DECREASED LEAKAGE AND METHOD OF MAKING SAME

(71) Applicant: Glo AB, Lund (SE)

(72) Inventors: Scott Brad Herner, San Jose, CA (US);
Cynthia Lemay, Santa Clara, CA (US);
Carl Patrik Theodor Svensson, Palo Alto, CA (US); Linda Romano, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/298,374

(22) Filed: Jun. 6, 2014

(65) Prior Publication Data

US 2014/0284551 A1    Sep. 25, 2014

Related U.S. Application Data

(63) Continuation of application No. PCT/US2014/028208, filed on Mar. 14, 2014.

(60) Provisional application No. 61/832,309, filed on Jun. 7, 2013, provisional application No. 61/832,350, filed on Jun. 7, 2013, provisional application No. 61/791,739, filed on Mar. 15, 2013.

(51) Int. Cl.
*H01L 29/06* (2006.01)
*H01L 31/0328* (2006.01)
(Continued)

(52) U.S. Cl.
CPC ............ *H01L 33/24* (2013.01); *H01L 33/007* (2013.01); *B82Y 20/00* (2013.01); *Y10S 977/762* (2013.01); *Y10S 977/95* (2013.01)

(58) Field of Classification Search
CPC . H01L 33/06; H01L 33/0075; H01L 33/0025; H01L 33/32; H01L 33/24; H01L 33/18; H01L 33/46; H01L 33/62; H01L 29/413; H01L 29/068; H01L 29/0676
USPC ............ 257/9, 13, 14, 81, 82, 91, 99; 438/22, 438/24, 28, 29, 34, 44
See application file for complete search history.

(56) References Cited

U.S. PATENT DOCUMENTS

| 7,335,908 | B2 | 2/2008 | Samuelson et al. |
| 7,396,696 | B2 | 7/2008 | Kim et al. |

(Continued)

FOREIGN PATENT DOCUMENTS

| JP | 2009/129941 A | 6/2009 |
| KR | 10-2005-0098539 A | 10/2005 |

(Continued)

OTHER PUBLICATIONS

U.S. Appl. No. 14/298,284, Office Action issued Apr. 21, 2015, 12pgs.

(Continued)

*Primary Examiner* — Hsien Ming Lee
(74) *Attorney, Agent, or Firm* — The Marbury Law Group PLLC

(57) ABSTRACT

A semiconductor device includes a plurality of first conductivity type semiconductor nanowire cores located over a support, and an insulating mask layer located over the support. The nanowire cores include semiconductor nanowires epitaxially extending from portions of a semiconductor surface of the support exposed through openings in the insulating mask layer. The device also includes a plurality of second conductivity type semiconductor shells extending over and around the respective nanowire cores, a first electrode layer that contacts the second conductivity type semiconductor shells and extends into spaces between the semiconductor shells, and an insulating layer located between the insulating mask layer and the first electrode in the spaces between the semiconductor shells.

19 Claims, 12 Drawing Sheets

(51) Int. Cl.
*H01L 27/15* (2006.01)
*H01L 29/205* (2006.01)
*H01L 21/00* (2006.01)
*H01L 33/24* (2010.01)
*H01L 33/00* (2010.01)
*B82Y 20/00* (2011.01)

(56) References Cited

U.S. PATENT DOCUMENTS

| | | |
|---|---|---|
| 7,829,443 B2 | 11/2010 | Seifert et al. |
| 8,309,439 B2 | 11/2012 | Seifert et al. |
| 8,350,251 B1 * | 1/2013 | Lowgren et al. ........ 257/13 |
| 8,664,094 B2 | 3/2014 | Seifert et al. |
| 2008/0036038 A1 | 2/2008 | Hersee et al. |
| 2010/0006817 A1 | 1/2010 | Ohlsson et al. |
| 2011/0309382 A1 | 12/2011 | Lowgren |
| 2013/0092900 A1 | 4/2013 | Lowgren et al. |
| 2014/0061586 A1 | 3/2014 | Seifert et al. |

FOREIGN PATENT DOCUMENTS

| | | |
|---|---|---|
| WO | WO2007/102781 A1 | 9/2007 |
| WO | WO2008/048704 A2 | 4/2008 |
| WO | WO2010/014032 A1 | 2/2010 |

OTHER PUBLICATIONS

U.S. Appl. No. 14/298,284, filed Jun. 6, 2014, GLO AB.

PCT/US14/24805, Mar. 12, 2014, GLO AB.

International Search Report and Written Opinion received in connection with International Application No. PCT/US2014/28208 mailed Jun. 25, 2014.

Morimoto, S. et al., "Manufacturable and Reliable Spin-On-Glass Planarization Process for 1 um CMOS Double Layer Metal Technology," Portland Technology Development, Intel Corporation, Hillsboro, Oregon, pp. 411-418 (1998).

* cited by examiner

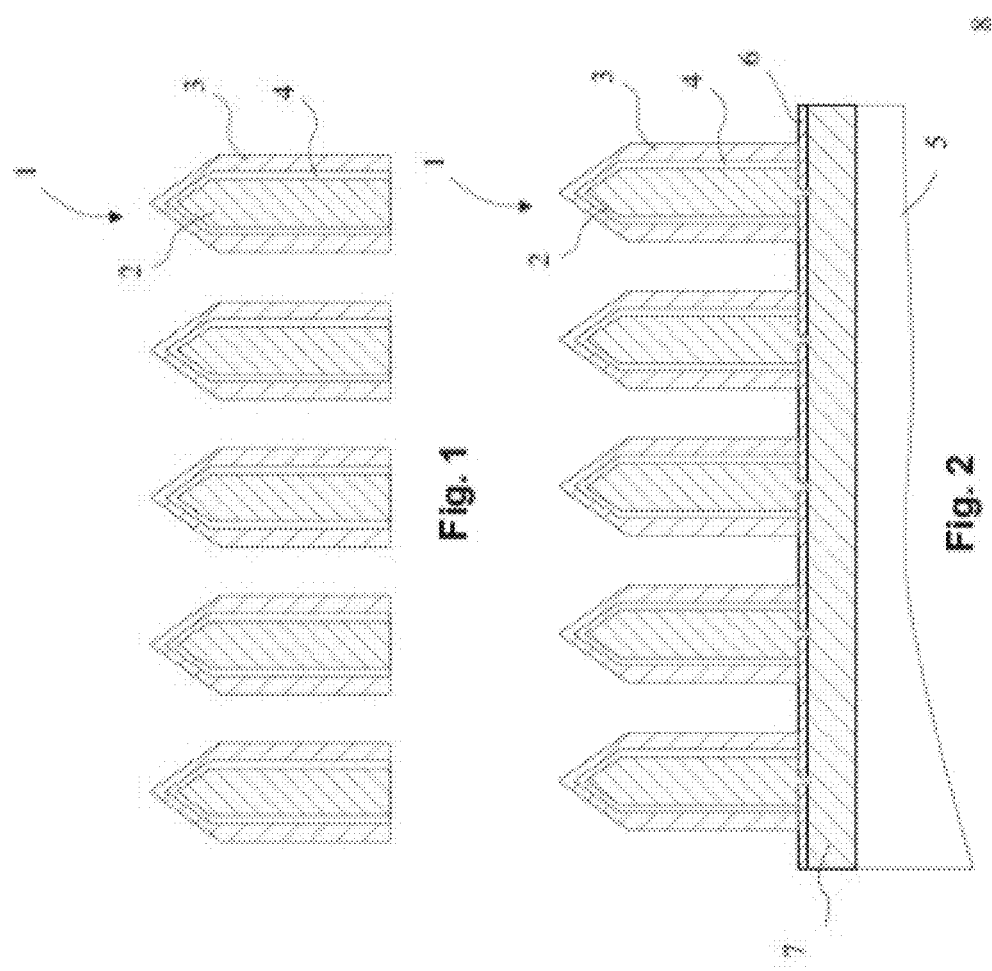

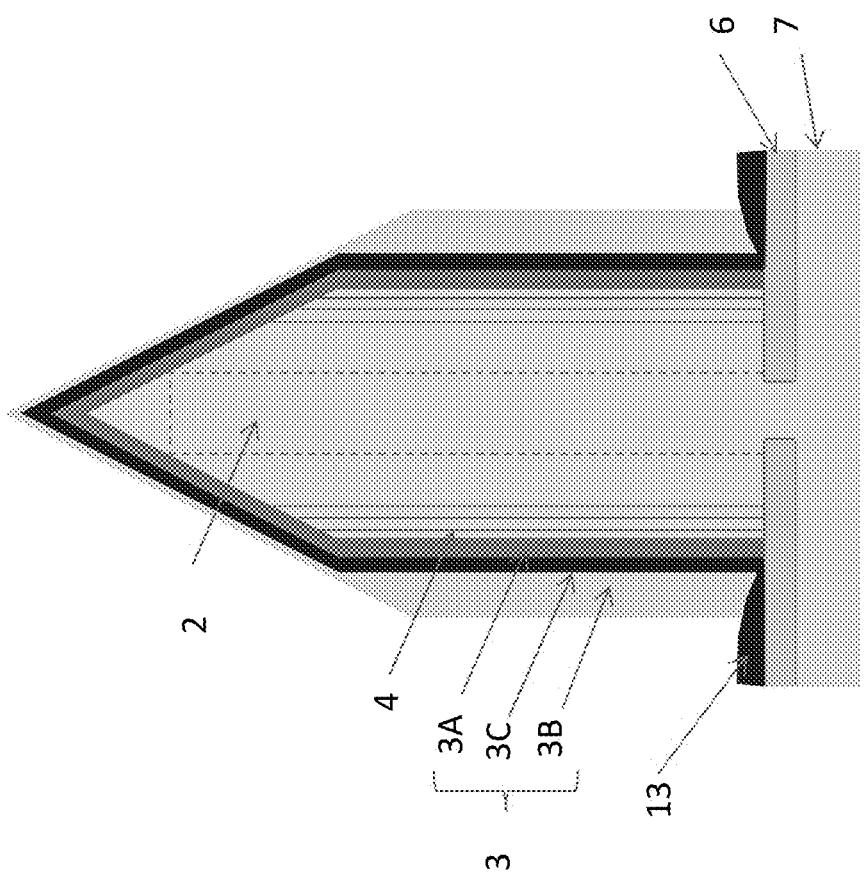

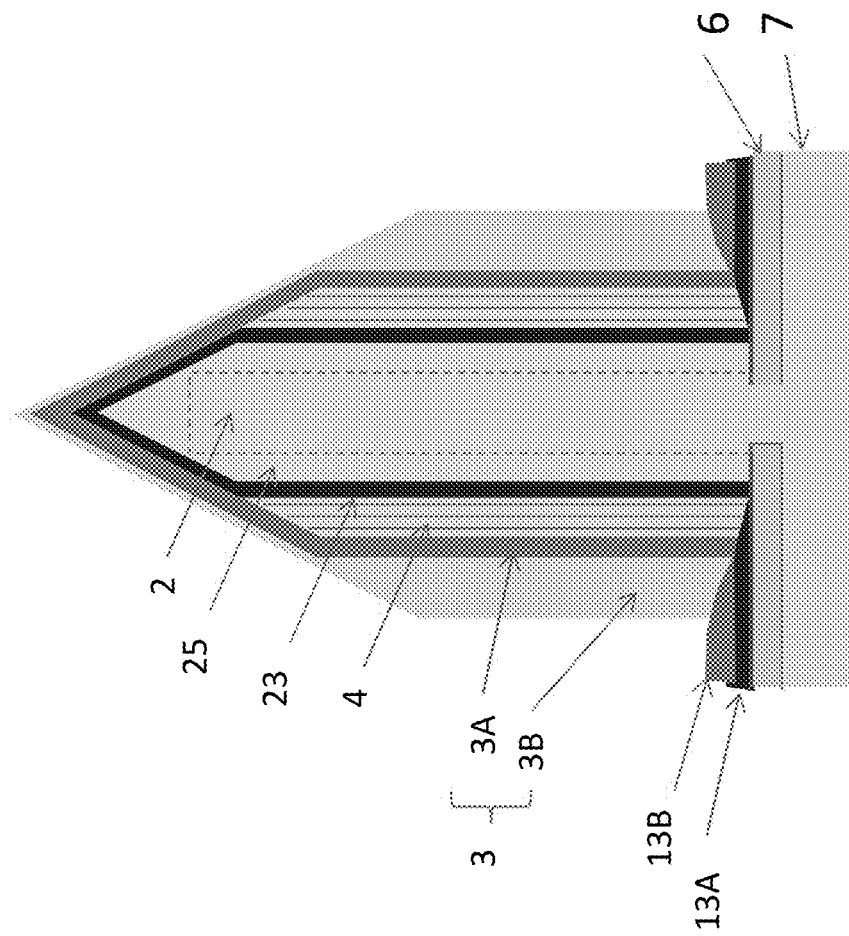

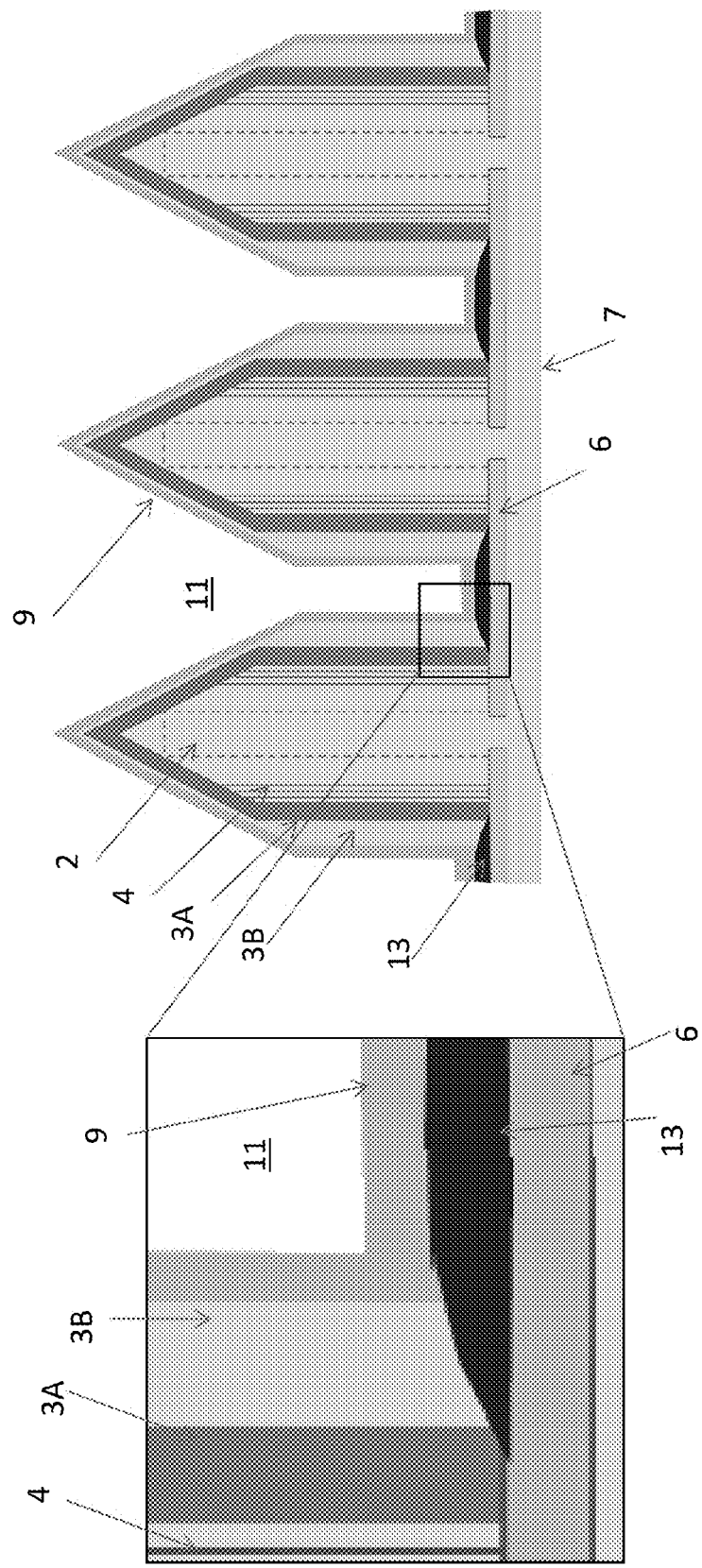

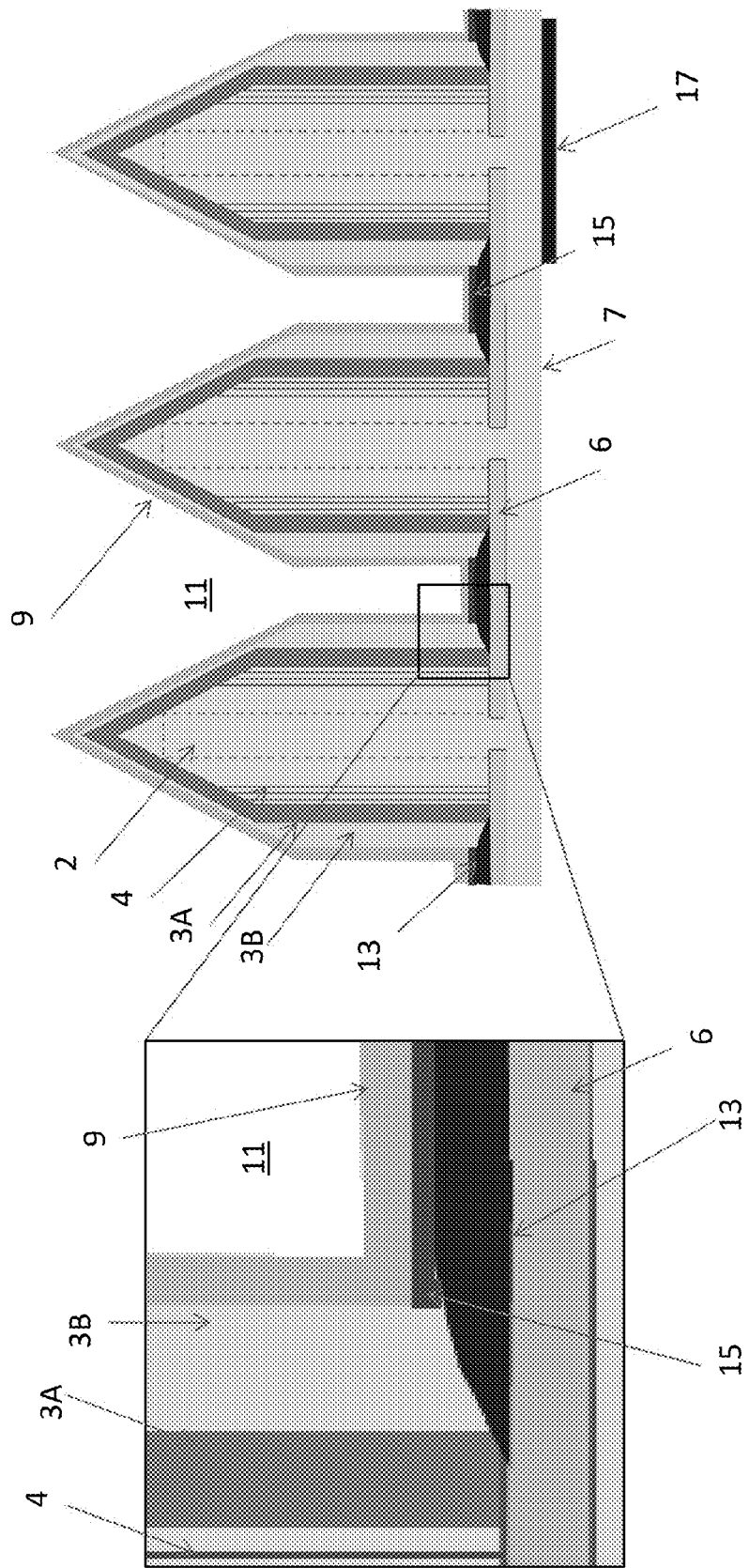

US 9,196,792 B2

NANOWIRE LED STRUCTURE WITH DECREASED LEAKAGE AND METHOD OF MAKING SAME

CROSS REFERENCE TO RELATED APPLICATION

This application is a continuation application of PCT/US14/28208, filed Mar. 14, 2013, which claims the benefit of priority of (1) U.S. Provisional Patent Application Ser. No. 61/832,309, filed Jun. 7, 2013; (2) U.S. Provisional Patent Application Ser. No. 61/832,350, filed Jun. 7, 2013; and (3) U.S. Provisional Patent Application Ser. No. 61/791,739, filed Mar. 15, 2013, all of which are incorporated herein by reference in their entirety.

FIELD

The embodiments of the invention are directed generally to semiconductor devices, such as nanowire light emitting diodes (LED), and specifically to nanowire LEDs with an additional insulating layer at the base of the nanowire to decrease leakage current.

BACKGROUND

Nanowire light emitting diodes (LED) are of increasing interest as an alternative to planar LEDs. In comparison with LEDs produced with conventional planar technology, nanowire LEDs offer unique properties due to the one-dimensional nature of the nanowires, improved flexibility in materials combinations due to less lattice matching restrictions and opportunities for processing on larger substrates.

SUMMARY

In one aspect, a semiconductor device includes a plurality of first conductivity type semiconductor nanowire cores located over a support, an insulating mask layer located over the support, wherein the nanowire cores comprise semiconductor nanowires epitaxially extending from portions of a semiconductor surface of the support exposed through openings in the insulating mask layer, a plurality of second conductivity type semiconductor shells extending over and around the respective nanowire cores, a first electrode layer that contacts the second conductivity type semiconductor shells and extends into spaces between the semiconductor shells, and an insulating layer located between the insulating mask layer and the first electrode in the spaces between the semiconductor shells.

BRIEF DESCRIPTION OF THE DRAWINGS

FIG. 1 schematically illustrates a side cross sectional view of a basis of a nanowire LED in accordance with embodiments of the invention.

FIG. 2 schematically illustrates a side cross sectional view of a nanowire LED structure on a buffer layer in accordance with embodiments of the invention.

FIGS. 3A, 3B, 3C, 3D, 4A and 4B schematically illustrate side cross sectional views of a nanowire LED in accordance with embodiments of the invention.

FIGS. 5A, 5B, 5C and 5D schematically illustrate side cross sectional views of a nanowire LED in accordance with embodiments of the invention.

FIGS. 6A and 6B are micrographs showing the base region formation of FIGS. 3A and 3B, respectively. FIG. 6C is a micrograph after SOG layer deposition, drying, and annealing. FIG. 6D is a micrograph after partial etch of the SOG layer by hydrofluoric acid (HF) solution.

DETAILED DESCRIPTION OF THE EMBODIMENTS OF THE INVENTION

Figure 3A:
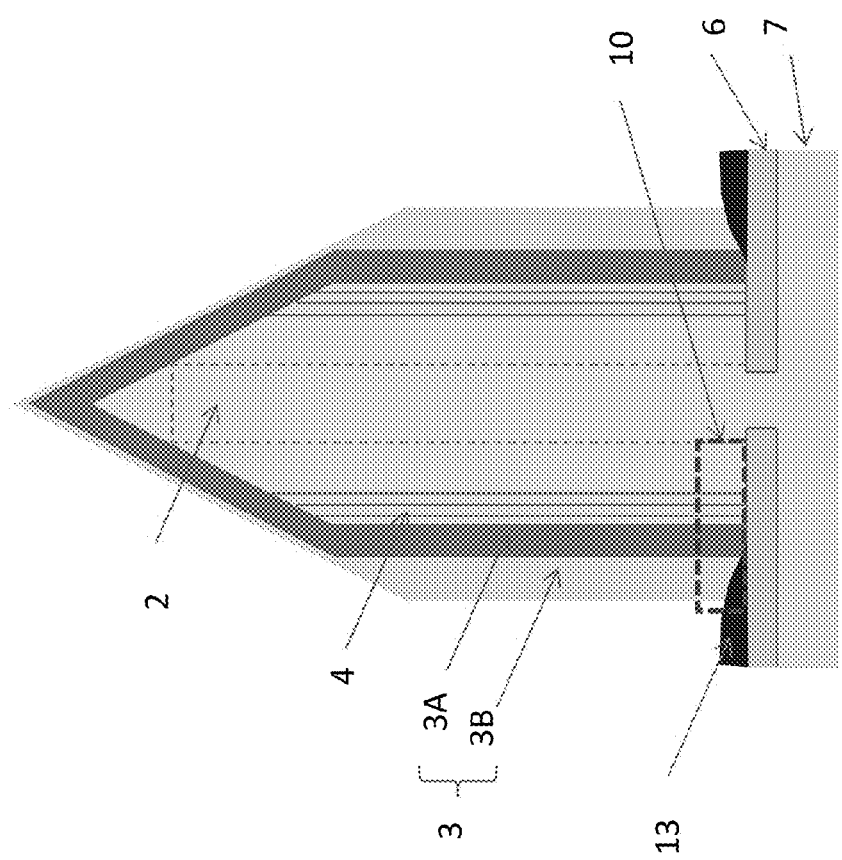

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. The nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure.

All references to upper, top, lower, downwards etc. are made as considering the substrate being at the bottom and the nanowires extending upwards from the substrate. Vertical refers to a direction perpendicular to the plane formed by the substrate, and horizontal to a direction parallel to the plane formed by the substrate. This nomenclature is introduced for the easy of understanding only, and should not be considered as limiting to specific assembly orientation etc.

Any suitable nanowire LED structure as known in the art may be used in the methods of the invention. Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

FIG. 1 schematically illustrates the basis for a nanowire LED structure that is modified in accordance with embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowire LEDs 1 having an n-type nanowire core 2 and a p-type shell 3 at least partly enclosing the nanowire core 2 and an intermediate active region 4, which may comprise a single intrinsic or lightly doped (e.g., doping level below $10^{16}$ cm$^{-3}$) semiconductor layer or one or more quantum wells, such as 3-10 quantum wells comprising a plurality of semiconductor layers of different band gaps. However, for the purpose of embodiments of the invention nanowire LEDs are not limited to this. For example the nanowire core 2, the active region 4 and the p-type shell 3 may be made up from a multitude of layers or segments. In alternative embodiments, only the core 2 may comprise a nanostructure or nanowire by having a width or diameter below 2 micron, while the shell 3 may have a width or diameter above one micron.

The III-V semiconductors are of particular interest due to their properties facilitating high speed and low power electronics and optoelectronic devices such as lasers and LEDs. The nanowires can comprise any semiconductor material, and suitable materials for the nanowire include but are not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$ cm$^{-3}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductor (e.g., InP, GaAs). In order to function as a LED, the n-side and p-side of each nanowire LED 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified by the "pyramid" facets and the vertical sidewall facets. The LEDs can be fabricated so that the emission layer formed on templates with dominant pyramid facets or sidewall facets. The same is true for the contact layer, independent of the shape of the emission layer.

FIG. 2 illustrates an exemplary structure that provides a support for the nanowires. By growing the nanowires on a growth substrate 5, optionally using a growth mask, or dielectric masking layer, 6 (e.g., a nitride layer, such as silicon nitride dielectric masking layer) to define the position and determine the bottom interface area of the nanowires, the substrate 5 functions as a carrier for the nanowires that protrude from the substrate 5, at least during processing. The bottom interface area of the nanowires comprises the root area of the core 2 inside each opening in the dielectric masking layer 6. The substrate 5 may comprise different materials, such as III-V or II-VI semiconductors, Si, Ge, Al$_2$O$_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowire cores 2 are grown directly on the growth substrate 5.

Preferably, the substrate 5 is also adapted to function as a current transport layer connecting to the n-side of each nanowire LED 1. This can be accomplished by having a substrate 5 that comprises a semiconductor buffer layer 7 arranged on the surface of the substrate 5 facing the nanowire LEDs 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire LEDs 1 may comprise several different materials (e.g., GaN core, GaN/InGaN multiple quantum well active region and AlGaN shell having a different In to Ga ratio than the active region). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The use of sequential (e.g., shell) layers gives that the final individual device (e.g., a pn or pin device) may have a shape anywhere between a pyramid or tapered shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 2 micron, and heights ranging from a few 100 nm to several (e.g., 10) μm.

The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

LED radiation (e.g., visible light, UV or IR) emission can be reduced by unintentional leakage of current in the diode. One source of leakage has been identified by its physical location at the "foot" or base region 10 of the nanowire LED, as shown in FIG. 3A. The foot or base region 10 is located over the mask 6 between the shell 3 and the nanowire core 2. This base leakage manifests itself by relatively high currents at <2V, which is below the "turn on" of the diode at 2.5-3.5 volts.

The first embodiment of the invention provides a structure and method to reduce this leakage current by decreasing contamination of the masking layer 6 during III-nitride semiconductor layer growth.

Without wishing to be bound by a particular theory, it is believed that decomposition of the silicon nitride masking layer 6 can occur during the growth of high temperature (e.g., at a temperature of at least 850 C) of binary, ternary or quaternary III-nitride semiconductor layers, such as (Al)(In)GaN layers (i.e., AlGaN, InGaN and/or InAlGaN active and/or shell layers). The masking layer 6 is continuously exposed during the growth of (Al)(In)GaN layers because (Al)(In)GaN easily desorbs from the silicon nitride masking layer 6 surface at the high temperature. Contamination of the silicon nitride masking layer from the III-nitride semiconductor growth can potentially create or worsen a leakage current for the device.

In one aspect of the first embodiment, the present inventors discovered that this base leakage may be reduced by the formation of a semiconductor foot 13 portion of the shell 3 that extends away from the shell over the surface of the mask 6 exposed between the nanowire cores 2, as shown in FIGS. 3A, 3B, 4A and 4B. The foot 13 protects the masking layer 6 from contamination during the growth of the other III-nitride layers and thus may reduce the leakage current.

Specifically, the shell 3 may comprise plural sublayers, such as an inner shell 3A over the active region 4 and an outer shell 3B over the inner shell. If the nanowire core 2 comprises an n-type III-nitride semiconductor, such as n-type GaN, then the shell sublayers 3A, 3B may comprise p-type III-nitride semiconductor sublayers with a different composition. For example, the inner shell 3A may comprise p-AlGaN and the outer shell 3B may comprise p-GaN.

In an embodiment of the invention, a polycrystalline p-AlGaN foot 13 portion of the inner shell 3A may be formed over the exposed portion of the silicon nitride mask 6 between the nanowire cores 2 and shells 3 during the growth of the inner shell 3A. The foot 13 portion may be formed, for example, by selecting a growth temperature (for example a growth temperature lower than 850C) and/or CVD precursor gas flow ratio (for example a ratio of the Al containing gas to the ammonia gas, and/or or a ratio of nitrogen to ammonia) that results in the formation of the polycrystalline p-AlGaN foot 13 portion. Other growth conditions or parameters may also be used.

The resistivity of the AlGaN layer increases with increasing Al concentration. Thus, the AlGaN foot 13 portion containing at least 5 atomic percent aluminum has a relatively high resistivity to reduce leakage current. The foot 13 portion also provides a chemically resistant layer to protect the masking layer 6 during device processing and may also behave as a getter for oxygen impurities due to the strong atomic bond of oxygen with Al.

Specifically, AlGaN foot 13 portion may be deposited directly on the silicon nitride masking layer 6. The AlGaN layer can be deposited anytime during the device growth. For example, the AlGaN layer may comprise the inner shell 3A which forms the foot 13 portion during growth on the masking layer 6, as shown in FIG. 3A. The combination of the shell 3A which contains a foot portion 13 can also be referred to as a foot blocking layer.

Alternatively, the AlGaN layer may comprise an intermediate shell 3C located between the inner AlGaN shell 3A and the outer GaN shell 3B, as shown in FIG. 3B. Thus, a first p-AlGaN inner shell 3A may be grown as an electron barrier after the active region 4 quantum well growth. In one embodiment, the p-AlGaN inner shell 3A may contain less than 10 atomic % Al, such as 2-5 atomic % Al to provide a higher conductivity.

This inner shell 3A does not form the foot 13 potion. Then, the p-AlGaN intermediate shell 3C is grown on the inner shell 3A with greater than 5 atomic % Al, such as at least 10 atomic % Al. The intermediate shell 3C forms the foot 13 portion on the masking layer 6, as shown in FIG. 3B. The outer p-GaN shell 3B is grown on the intermediate shell 3C and on the foot 13 portion.

Alternatively, the AlGaN shell 3C can be grown over the active region 4 prior to the AlGaN shell 3A growth. In this case, the foot 13 portion is formed prior to the AlGaN shell growth.

Preferably, shells 3A, 3B and optionally 3C are grown by MOCVD with the p-type dopant source (e.g., Mg containing metal-organic gas, such as $(Cp)_2Mg$) included in the precursor flows. However the AlGaN shell (e.g., shell 3A in FIG. 3A or shell 3C in FIG. 3B) may also be grown without intentional doping. This way, the AlGaN shell and the foot region are intrinsic rather than p-type doped.

In another alternative aspect of the first embodiment, the foot 13 region is formed prior to the active region 4 formation. In this aspect shown in FIG. 3C, an optional n-GaN shell 25 is formed around the nanowire core 2. Then, an intrinsic or n-type doped AlGaN shell 23 (e.g., Si-doped n-AlGaN) is formed having more than 5 atomic percent Al. The AlGaN shell 23 growth step also forms an n-AlGaN foot 13 portion on the masking layer 6. The active region 4 (e.g., GaN/InGaN quantum wells), and the outer shell 3 (which may comprise p-AlGaN shell 3A and p-GaN shell 3B) are then formed on the foot 13 region.

In another embodiment, two foot 13A, 13B portions are disposed on the dielectric masking layer 6, as shown in FIG. 3D. The structure of FIG. 3D is a combination of the structures of FIGS. 3C and 3A. As shown in FIG. 3D, a first conductivity type (e.g., n-type) AlGaN shell 23 having a foot 13A portion is formed over the first conductivity type core 2 and optionally on at least one shell 25 of the first conductivity type. The shell 23 portion of the first conductivity type foot blocking layer formed on shell 25 has a single crystalline structure, and the foot 13A portion of the first conductivity type blocking layer has a polycrystalline structure formed on the dielectric masking layer 6. The first conductivity type foot blocking layer comprises a dopant which provides a first conductivity type in a III-nitride semiconductor (such as Si for n-type semiconductor), such that the conductivity type of the crystalline portion 23 of said first foot blocking layer has the same conductivity type as the first conductivity type of the core 2 and shell 25.

A second conductivity type (e.g., p-type) AlGaN foot blocking layer is then formed after formation of the active region 4, as shown in FIG. 3D. The second conductivity type (e.g., p-type) AlGaN foot blocking layer may comprise the second conductivity type shell 3A having a foot 13B portion of the second conductivity type, similar to that shown in FIG. 3A. Alternatively, the second conductivity type (e.g., p-type) AlGaN foot blocking layer may comprise the second conductivity type shell 3C having a foot 13B portion of the second conductivity type, similar to that shown in FIG. 3B.

The shell 3A portion of the second conductivity type foot blocking layer formed on the active region 4 (or on another shell, such as 3C) has a single crystalline structure, and the foot 13B portion of the second conductivity type blocking layer has a polycrystalline structure formed on the polycrystalline foot 13A portion of the first conductivity type blocking layer. The second conductivity type foot blocking layer comprises a dopant which provides a second conductivity type in a III-nitride semiconductor (such as Mg for p-type semiconductor), such that the conductivity type of the crystalline portion 3A of said second foot blocking layer has the same conductivity type as the outer shell 3B (e.g., p-GaN shell). Thus, the device shown in FIG. 3D contains two polycrystalline foot (e.g., 13A, 13B) portions of opposite conductivity type located one over the other. This forms a p-n diode foot 13A/13B portion which further reduces or prevents contamination of the masking layer 6 and prevents or decreases leakage current from the electrode 9 shown in FIGS. 4A and 4B into the core 2.

Figure 3C:
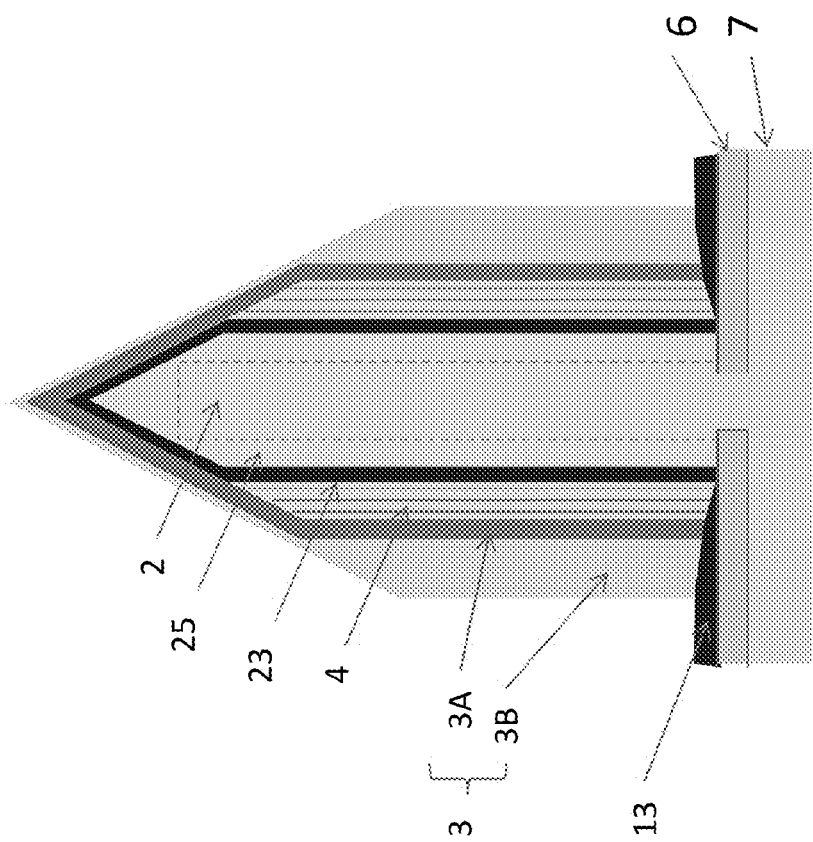
Figure 3E:
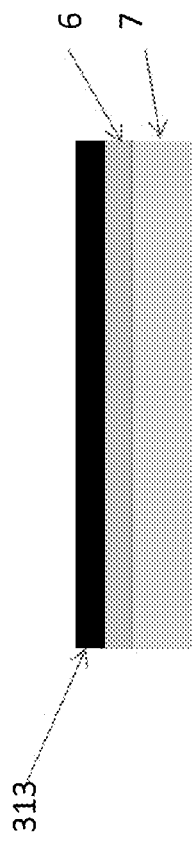
FIGS. 3E, 3F, 3G and 3H schematically illustrate side cross sectional views of steps in a method of making a nanowire LED in accordance with embodiments of the invention.
Figure 3F:
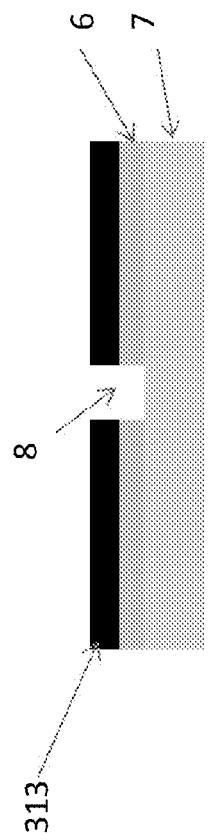

In another alternative embodiment shown in FIGS. 3E and 3F, the foot blocking layer 313 is deposited on the dielectric masking layer 6 prior to forming openings 8 in the masking layer 6. As shown in FIG. 3E, the foot blocking layer 313 is deposited on the masking layer 6. The foot blocking layer 313 may comprise a p-type or n-type AlGaN layer described above. Preferably, layer 313 has the opposite conductivity type (e.g., p-type) to the core 2 conductivity type (e.g., n-type) to reduce leakage current. Then, as shown in FIG. 3F, the openings 8 are formed through the foot blocking layer 313 and the masking layer 6 to expose the buffer layer 7 (or another portion of the support) using any suitable lithography and etching process. The core 2 and the remaining nanowire LED structure 1 comprising a core and shell layers are then formed as described above with respect to FIGS. 1 and 2.

Figure 3G:
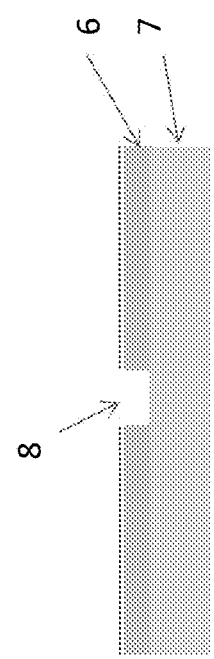
Figure 3H:
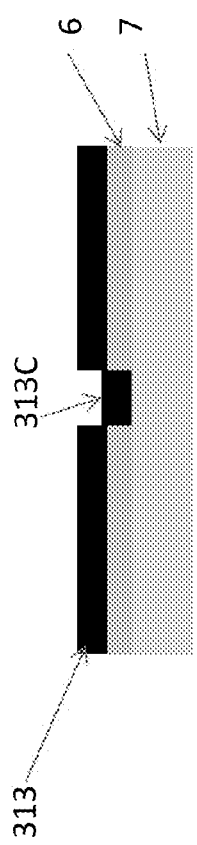

In another embodiment shown in FIGS. 3G and 3H, the foot blocking layer 313 is deposited on the dielectric masking layer 6 after the openings 8 have been formed in the masking layer. As shown in FIG. 3G, the openings 8 are first formed in the masking layer 6 to expose the buffer layer 7 (or another portion of the support) using any suitable lithography and etching process. Then, as shown in FIG. 3H, the foot blocking layer 313 is then formed over the masking layer 6. The foot blocking layer 313 may comprise p-type or n-type AlGaN layer described above. A portion 313C of the foot blocking layer 313 will thus be formed in the opening 8 on the buffer layer 7 (or on another portion of the support exposed in the opening 8). The portion 313C of the foot blocking layer 313 may be removed from the opening 8 by another etching step prior to forming the core 2. Alternatively, the core 2 may be formed directly on the portion 313C of the blocking layer, in which case the core 2 and the blocking layer 313 preferably have the same conductivity type (e.g., n-type). The nanowire LED structure 1 comprising shell layers is then formed over the core 2. Additional foot 13 portions may be formed on the foot blocking layer 313 as described above and as shown in FIGS. 3A-3D.

In summary, the foot blocking layer (e.g., the entire layer 313 or foot 13 portions thereof) may be formed on the masking layer 6 before and/or after formation of the core 2, as shown in FIGS. 3E-3H and 3A-3D, respectively. The foot blocking layer 23/13 may be formed over the core 2 and over at least one shell layer 25 prior to forming the active region 4, as shown in FIG. 3C. Alternatively, the foot blocking layer 3A/13 or 3C/13 may be formed over the active region 4 after forming the active region 4, as shown in FIGS. 3A and 3B. Alternatively, the LED device may comprises multiple foot blocking layers (e.g., 23/13A and 3A/13B) having the same or opposite conductivity type formed before and/or after forming the active region, as shown in FIG. 3D.

The foot blocking layer preferably comprises one or more of Al, Ga, In, B, Si, Mg, N, such as a III-nitride semiconductor, where Si and/or Mg are added as n-type and p-type dopants. In one embodiment, the foot blocking layer comprises AlGaN and has a polycrystalline structure in the regions (e.g., 13, 313) formed on the dielectric masking layer 6. Regions (e.g., shells 3A, 3C, 23) formed on a single crystalline layer, core or shell, may have a single crystalline structure. The foot blocking layer may be deposited by any one of several methods, such as metalorganic chemical vapor deposition (MOCVD), molecular beam epitaxy (MBE), plasma-enhanced chemical vapor deposition (PECVD), plasma-assisted molecular beam epitaxy (PAMBE), or reactive sputtering deposition. Other methods may be used as well. In a preferred embodiment, the foot blocking layer comprises polycrystalline AlGaN foot 13 portion on the dielectric masking layer 6 and a crystalline AlGaN 3A, 3C or 23 shell over a single crystal semiconductor nanowire shell, and is formed by MOCVD.

The thickness of the polycrystalline foot blocking layer (e.g., foot portion 13) located over the masking layer 6 may vary across the region between adjacent cores 2, such that the thickness is smallest nearest the cores, and greatest at the midpoint between two adjacent cores, as shown in FIGS. 3A-3D. Alternatively, the foot blocking layer 313 may has a uniform thickness as shown in FIGS. 3E, 3F and 3H. The thickness of the AlGaN foot 13 portion on the silicon nitride masking layer 6 is preferably greater than 10 nm to enable good surface coverage but less than 100 nm to not interfere with the outer shell 3B growth. For example, the AlGaN foot 13 portion or layer 313 may be 20-80 nm thick and contains at least 10 atomic percent Al, such as 10-15 atomic percent. However, other thicknesses may be used.

As shown in FIGS. 4A and 4B, the first (e.g., top or p-side) electrode 9 is then formed over the outer shells 3B of the LEDs and in the spaces 11 between the LEDs. The p-side electrode 9 contacts the relatively high resistivity semiconductor AlGaN foot 13 shown in FIGS. 3A-3C which lifts the electrode 9 away from the base region 10, which may decrease the undesirable current leakage path to the nanowire core 2.

The second embodiment of the invention provides a structure and method to reduce the leakage current by electrically isolating the base region 10 of leakage current from the upper electrode 9 and from the rest of the device.

Specifically, as shown in FIGS. 5A and 5B, an insulating layer 15 is formed between the insulating mask layer 6 and the top electrode 9 in the spaces 11 between the semiconductor shells 3 to prevent or reduce the leakage current in the base region 10. FIG. 5A illustrates a semiconductor device, such as an LED device, which contains the plurality of first conductivity type (e.g., n-type) semiconductor nanowire cores 2 located over a support. The insulating mask layer 6 is located over the support. As described above, the nanowire cores 2 comprise semiconductor nanowires epitaxially extending from portions of a semiconductor surface (e.g., buffer layer 7 surface) of the support exposed through openings in the insulating mask layer 6. A plurality of second conductivity type semiconductor shells 3 extend over and around the respective nanowire cores 2. The top (e.g., p-side) electrode layer 9 contacts the second conductivity type semiconductor shells 3 and extends into spaces 11 between the semiconductor shells.

Preferably, as described above, the LED device also contains an active region shell 4 around each of the plurality of nanowire cores 2. In an embodiment, the active region shell comprises at least one quantum well, and the second conductivity type semiconductor shell 3 surrounds the at least one quantum well to form a light emitting p-i-n junction at each nanowire core 2 surrounded by the at least one quantum well shell 4.

As described above, the semiconductor shells 3A, 3C or 23 optionally comprise a semiconductor foot 13 portion the first embodiment. which extends on the insulating masking layer 6 in the spaces 11 between the semiconductor shells. As shown in FIGS. 5B and 5C, the insulating layer 15 is located on the semiconductor foot 13 portion such that the top electrode 9 contacts the insulating layer 15 and does not contact the foot portion 13 in the spaces 11. The foot 13 portion in FIG. 5B is formed as part of the p-type shell 3 (e.g., shell 3A or 3C of FIG. 3A or 3B), while the foot portion in FIG. 5C is formed as part of the n-type shell 23 of FIG. 3C. Thus, the insulating layer prevents or reduces the leakage current which flows through the foot portion 13 between the top electrode 9 and the nanowire core 2.

As also described above, the second conductivity type semiconductor shell 3 preferably comprises a substantially single crystal AlGaN interior shell 3A, 3C or 23 having greater than 5 atomic % aluminum, and a substantially single crystal p-GaN outer shell 3B. The semiconductor foot portion 13 comprises a polycrystalline AlGaN foot portion of the AlGaN interior shell. The polycrystalline p-AlGaN foot portion 13 connects to the substantially single crystal AlGaN interior shell 3A, 3C or 23 under the p-GaN outer shell 3B. As used herein, substantially single crystal means a single crystal semiconductor which may have some defects, such as dislocations and/or stacking faults, and/or several grain boundaries, but lacks over ten grains typically found in polycrystalline material shells and layers. Specifically, in the embodiment shown in FIG. 5C, the insulating layer 15 prevents the formation of a p-n junction between the n-AlGaN foot 13 portion and the p-type shell 3 (e.g., p-GaN shell 3B).

Figure 5D:
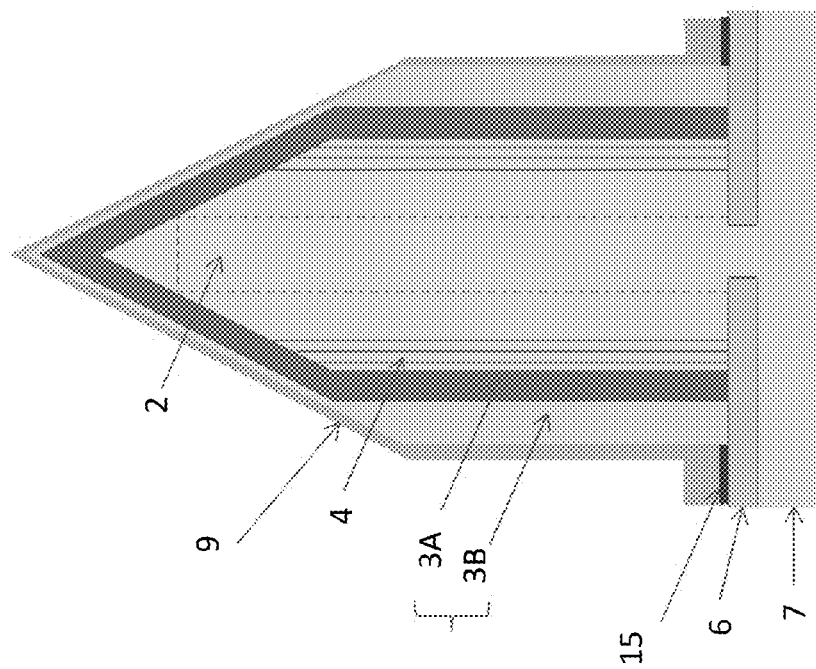
Figure 5C:
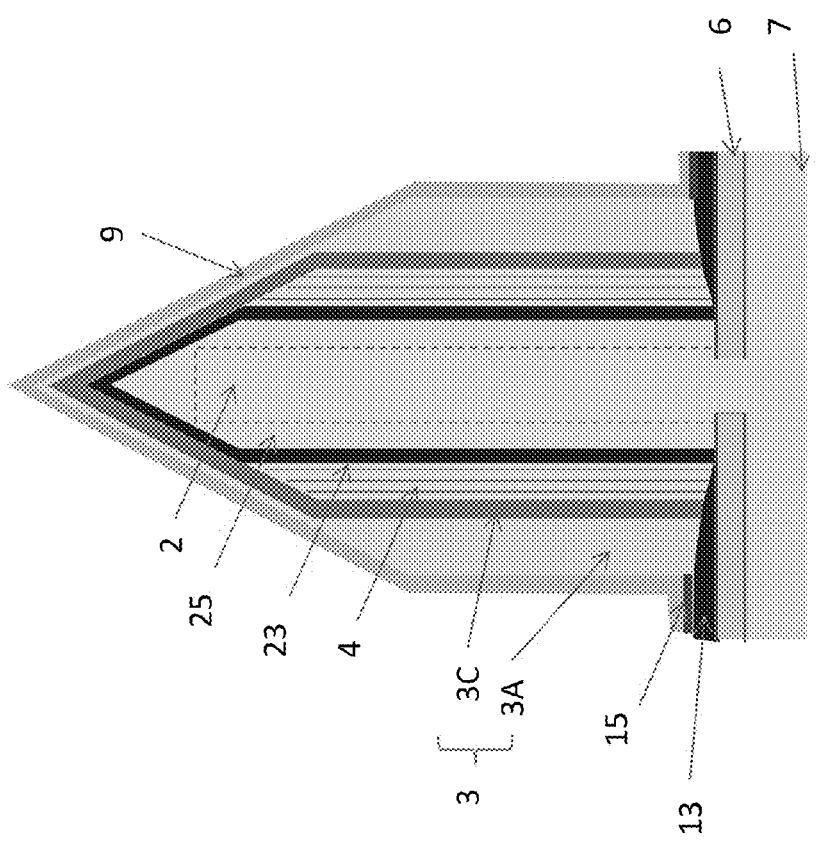

In another aspect of the second embodiment shown in FIG. 5D, the insulating layer 15 is used in a device which lacks the foot 13 portion. In this device, the insulating layer 15 is located over the masking layer 6. Thus, layer 15 protects the masking layer 6 and raises the electrode 9 away from the base portion 10 of the device where leakage current occurs.

The insulating layer 15 may comprise any suitable insulating layer, such as silicon oxide, silicon nitride, high-k dielectrics (e.g., alumina, hafnium oxide, organic dielectrics, etc.). Preferably, the insulating layer 15 comprises a spin-on dielectric, such as spin-on glass or another suitable spin-on dielectric.

A second electrode layer 17 (e.g., n-side electrode) shown in FIG. 5A electrically connects to the n-type nanowire cores 2. The electrode 17 may be formed on the bottom of the substrate 5 if the substrate 5 is a semiconductor (e.g., silicon or GaN) or conductive substrate. Alternatively, the second electrode 17 may contact the n-type semiconductor buffer layer 7 on the substrate 5 from the top side in a region where the nanowires 1 and the top electrode 9 have been removed.

As described above, in a preferred embodiment, the buffer layer 7 comprises an n-GaN or n-AlGaN layer, the nanowire cores 2 comprise n-GaN nanowires, the at least one quantum well 4 comprises plural InGaN/GaN quantum wells and the top electrode 9 comprises a transparent conductive oxide (TCO), such as indium tin oxide or aluminum zinc oxide. Electrode 17 may comprise any suitable electric conductor, such as a metal.

FIGS. 6A, 6B, 6C and 6D are SEM micrographs illustrating one method of making the device of FIGS. 5A and 5B. First, as described above, a plurality of first conductivity type semiconductor nanowire cores 2 are epitaxially grown from portions of a semiconductor surface (e.g., the buffer layer 7) of a support exposed through openings in an insulating mask layer 6 on the support. Then, optional shell(s) 23, 25 of FIG. 3C and the active region (e.g., quantum wells) 4 are formed surrounding the cores 2. A plurality of second conductivity type semiconductor shells 3 are then formed extending over and around the respective nanowire cores 2.

As described above, the step of forming the semiconductor shells 3 comprises forming (e.g., epitaxially growing by CVD) substantially single crystal semiconductor shell portions (e.g., inner shells 3A, outer shells 3B and optional intermediate shells 3C) extending over and around the respective nanowire cores 2 and optionally the polycrystalline semiconductor foot portions 13 which extend horizontally on the insulating masking layer 6 in the spaces 11 between the semiconductor shells 3 during the same CVD growth step. For example, the substantially single crystal p-AlGaN inner shell 3A or intermediate shell 3C having more than 5% aluminum is epitaxially grown over the semiconductor active region 4 (e.g., the quantum wells) by CVD while the optional polycrystalline p-AlGaN foot portion 13 is grown at the same time on the silicon nitride masking layer 6. Then, the substantially single crystal p-GaN outer shell 3B is epitaxially grown on the substantially single crystal inner shell 3A (or the intermediate shell 3C) but not on the foot portion 13.

Figure 6B:
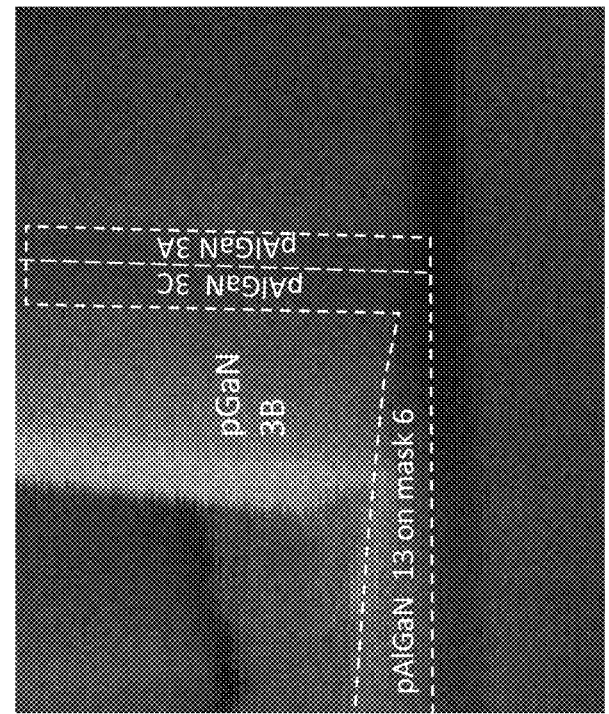
FIGS. 6A, 6B, 6C and 6D are SEM micrographs showing the steps in a method of making a nanowire LED in accordance with embodiments of the invention.
Figure 6A:
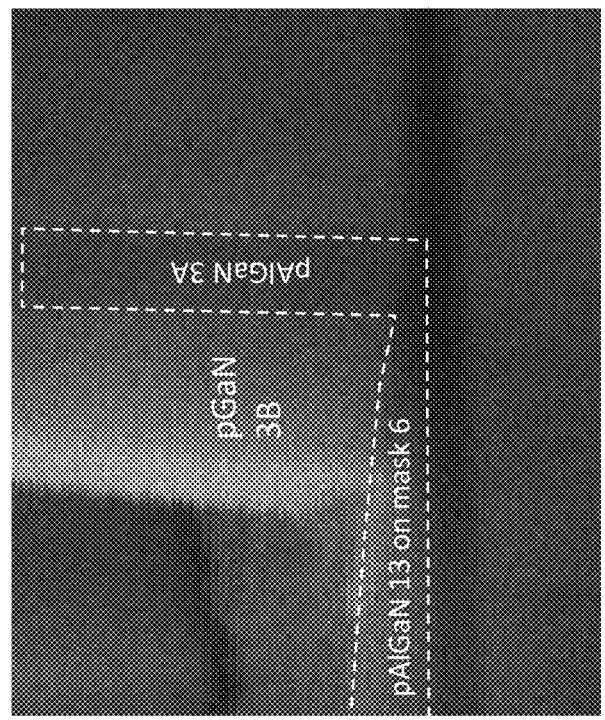

Without being bound by a particular theory, it is believed that the outer shell 3B does not grow horizontally (i.e., having a smaller thickness in the vertical direction than the length and width in the horizontal plane) on the foot portion 13. Thus, as shown in FIG. 6A, the p-AlGaN foot portion 13 may connect to the p-AlGaN inner shell 3A under the p-GaN outer shell 3B. Alternatively, as shown in FIG. 6B, the p-AlGaN foot portion 13 may connect to the p-AlGaN intermediate shell 3C (or to the inner n-AlGaN shell 23 shown in FIG. 3C) under the p-GaN outer shell 3B. Alternatively, the foot portion 13 may not be physically connected to any shell.

Figure 6D:
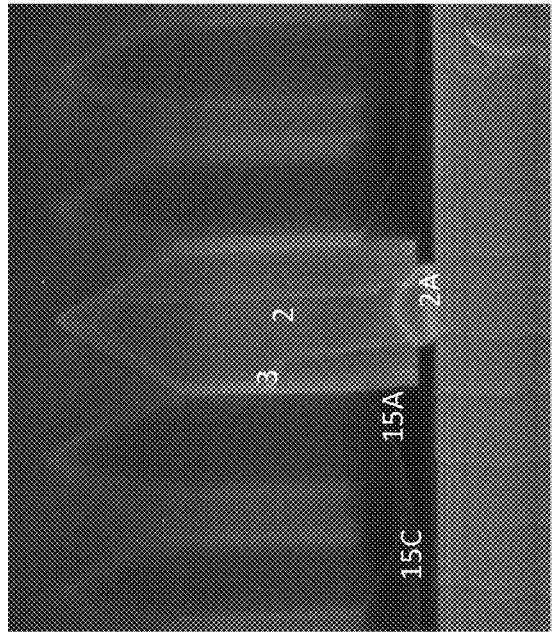
Figure 6C:
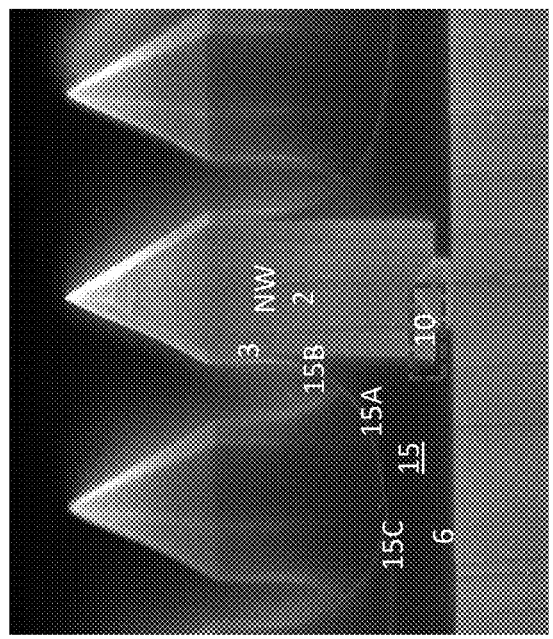

Then, as shown in FIG. 6C, an insulating layer 15 is formed over the insulating mask layer 6 in spaces 11 between the semiconductor shells 3, such that tips and sidewalls of the semiconductor shells 3 are exposed in the insulating layer 15. If the foot portion 13 is present, then the insulating layer 15 is formed on the foot portion 13 in the spaces 11. The insulating layer 15 prevents or reduces the current leakage path in the base region 10 between the outer shell 3B and the root 2A of the nanowire core 2.

Preferably, the step of forming the insulating layer 15 comprises spin-coating a spin-on dielectric layer. The spin-coating process forms the insulating layer 15 with a thicker portions 15A over the insulating masking layer 6 in the spaces 11 between the semiconductor shells and thinner portions 15B on the upper sidewalls of the semiconductor shells 3, as shown in FIG. 6C. The upper surface of the insulating layer is curved, with the thick portions 15A adjacent to the shells in spaces 11 and the medium thickness portions 15C in the spaces 11 away from the shells 3.

In a non-limiting example, the spin-on dielectric layer 15 is a spin-on-glass (SOG). SOG is formed by providing a silicate dissolved or suspended in a solvent. This solution is deposited on the top of the nanowire and shell containing substrate that is being spun at high revolutions per minute. The spin action distributes the SOG evenly over the shells 3 and in the spaces 11 on the substrate. After deposition, the SOG is slowly dried. For example, SOG may be dried first at a temperature of 75C, then at 150C, and finally at 250C. The drying process removes the solvent, leaving the silicate. After drying, the substrate with the spun-on silicate is annealed at higher temperature, typically 400-700C, which densifies the silicate into a SiO$_2$ network. The densified SiO$_2$ is a dielectric film with low leakage.

Then, as shown in FIG. 6D, the insulating layer 15 is isotropically, partially etched. This etching step removes the thinner portions 15B of insulating layer 15 from at least upper portions of the semiconductor shell 3 sidewalls and exposes at least the upper portions of the semiconductor shell sidewalls 3. However, the thicker portions 15A of the spin-on insulating layer 15 remain in the spaces 11 between the semiconductor shells 3 after the partial etch, even though the overall insulating layer thickness is decreased in the spaces 11. The curved upper surface is still retained with thicker portions 15A adjacent to the shells and thinner portions 15C away from the shells.

For example, the etching may comprise any suitable SOG wet etch, such as an isotropic wet etch by dilute hydrofluoric acid (HF) of the densified SOG layer 15. This etch can remove the thinner portions 15B of the layer from the sidewalls and tip of the shells 3 to enable an electrical contact to the sidewalls of the shells 3, while leaving the SOG layer thicker portions 15A in the base region 10 where it provides electrical insulation.

As shown in FIGS. 5A-5D, the top electrode layer 9 is then formed over the device shown in FIG. 6D. The top electrode layer 9 contacts the exposed tips and sidewalls of semiconductor shells 3. The top electrode layer 9 also contacts the insulating layer 15 in the spaces 11 between the semiconductor shells 3. Preferably, the top electrode layer 9 is a continuous layer that is formed on exposed tips and at least upper portions of the sidewalls of the semiconductor shells 3 (e.g., on the outer shell 3B) and on the insulating layer 15 in the spaces 11 between the semiconductor shells 3 such that the top electrode layer does not contact the polycrystalline semiconductor foot 13 portions if they are present.

Figure 7:
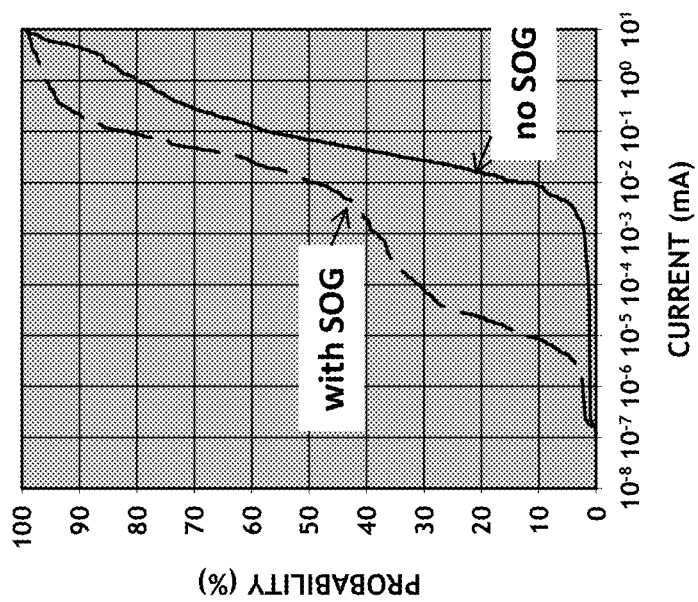
FIG. 7 is a probability plot of the current at +2V for about 500 devices composed of nanowire LEDs, with and without the SOG layer.

FIG. 7 is a probability plot of the current at +2V for about 500 devices composed of nanowire LEDs, with and without the SOG insulating layer 15 at the base or foot region 10. As can be seen from this figure, the current distribution is much tighter and the leakage current is lower for the LEDs with the SOG layer than without the SOG layer.

Although the present invention is described in terms of contacting of nanowire LEDs, it should be appreciated that other nanowire based semiconductor devices, such as field-effect transistors, diodes and, in particular, devices involving light absorption or light generation, such as, photodetectors, solar cells, lasers, etc., can be implemented on any nanowire structures.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

What is claimed is:

1. A semiconductor device, comprising:
 a plurality of first conductivity type semiconductor nanowire cores located over a support;
 an insulating mask layer located over the support, wherein the nanowire cores comprise semiconductor nanowires epitaxially extending from portions of a semiconductor surface of the support exposed through openings in the insulating mask layer;
 a plurality of second conductivity type semiconductor shells extending over and around the respective nanowire cores;
 a first electrode layer that contacts the second conductivity type semiconductor shells and extends into spaces between the semiconductor shells;
 an insulating layer located between the insulating mask layer and the first electrode layer in the spaces between the semiconductor shells; and
 an active region shell around each of the plurality of semiconductor nanowire cores;
 wherein the device comprises a light emitting diode (LED) device; and
 wherein the active region shell comprises at least one quantum well and each of the plurality of the second conductivity type semiconductor shells surrounds the at least one quantum well to form a light emitting p-i-n junction at each semiconductor nanowire core surrounded by the at least one quantum well.

2. The device of claim 1, wherein:
 each of the semiconductor shells comprises a semiconductor foot portion which extends on the insulating masking layer in the spaces between the semiconductor shells; and
 the insulating layer is located on the semiconductor foot portion such that the first electrode layer contacts the insulating layer and does not contact the semiconductor foot portion.

3. The device of claim 2, wherein:
 each of the plurality of the second conductivity type semiconductor shells comprises a p-AlGaN inner shell and p-GaN outer shell;
 the semiconductor foot portion comprises a p-AlGaN foot portion of the p-AlGaN inner shell; and
 the p-AlGaN foot portion connects to the p-AlGaN inner shell under the p-GaN outer shell.

4. The device of claim 1, further comprising a first conductivity type AlGaN shell, wherein:
 the first conductivity type AlGaN shell is located between the active region shell and a respective one of the plurality of first conductivity semiconductor nanowire cores;
 the first conductivity type AlGaN shell comprises a first conductivity type AlGaN foot portion which extends on the insulating masking layer in the spaces between the second conductivity type semiconductor shells;
 the insulating layer is located on the first conductivity type AlGaN foot portion such that the first electrode layer contacts the insulating layer and does not contact the first conductivity type AlGaN foot portion;
 each of the plurality of the second conductivity type semiconductor shells comprises a second conductivity type GaN outer shell; and
 the first conductivity type AlGaN foot portion connects to the first conductivity type AlGaN shell under the second conductivity type GaN outer shell and under the active region shell.

5. The device of claim 4, wherein the first conductivity type comprises n-type, the second conductivity type comprises p-type and the first electrode layer comprises a p-electrode layer.

6. The device of claim 5, further comprising a second electrode layer which electrically connects to the n-type semiconductor nanowire cores.

7. The device of claim 6, wherein the support comprises an n-type semiconductor buffer layer on a substrate.

8. The device of claim 7, wherein the buffer layer comprises an n-GaN or n-AlGaN layer, the semiconductor nanowire cores comprise n-GaN nanowires, the at least one quantum well comprises an InGaN/GaN quantum well and the first electrode layer comprises a transparent conductive oxide (TCO).

9. The device of claim 1, wherein the insulating layer comprises a spin-on dielectric.

10. The device of claim 9, wherein the spin-on dielectric comprises a spin-on glass layer having a curved upper surface.

11. A method of making a semiconductor device, comprising:
epitaxially growing a plurality of first conductivity type semiconductor nanowire cores from portions of a semiconductor surface of a support exposed through openings in an insulating mask layer on the support;
forming a plurality of second conductivity type semiconductor shells extending over and around the respective nanowire cores;
forming an insulating layer over the insulating mask layer in spaces between the semiconductor shells, such that tips and at least upper portions of sidewalls of the semiconductor shells are exposed in the insulating layer; and
forming a first electrode layer, wherein the first electrode layer contacts the exposed tips and the at least upper portions of sidewalls of semiconductor shells and the first electrode layer contacts the insulating layer in the spaces between the semiconductor shells;
wherein the step of forming the insulating layer comprises spin-coating a spin-on dielectric layer;
wherein the spin-on dielectric layer thickness is greater over the insulating mask layer in the spaces between the semiconductor shells than on the sidewalls of the semiconductor shells; and
further comprising isotropically, partially etching the spin-on dielectric layer to remove the spin-on dielectric from the at least upper portions of the semiconductor shell sidewalls and expose the at least upper portions of the semiconductor shell sidewalls while the spin-on dielectric layer remains in the spaces between the semiconductor shells.

12. The method of claim 11, wherein:
the step of forming the plurality of second conductivity type semiconductor shells comprises forming substantially single crystal semiconductor shell portions extending over and around the respective semiconductor nanowire cores and polycrystalline semiconductor foot portions which extend on the insulating masking layer in the spaces between the semiconductor shells; and
the step of forming the first electrode layer comprises forming a continuous first electrode layer on the exposed tips and the at least upper portions of the sidewalls of the semiconductor shells and on the insulating layer in the spaces between the semiconductor shells such that the first electrode layer does not contact the polycrystalline semiconductor foot portions.

13. The method of claim 12, wherein:
the step of forming the plurality of second conductivity type semiconductor shells each comprise forming inner p-AlGaN inner shells at a temperature below 850° C. and forming p-GaN outer shells;
the polycrystalline semiconductor foot portions comprise a polycrystalline p-AlGaN foot portion of the p-AlGaN inner shells; and
the p-GaN outer shells are formed over the p-AlGaN inner shells and the p-AlGaN foot portions such that the p-AlGaN foot portions connect to the respective p-AlGaN inner shells under the respective p-GaN outer shells.

14. The method of claim 11, further comprising forming first conductivity type AlGaN shells at a temperature below 850° C. between respective active region shells and the semiconductor nanowire cores, wherein:
the step of forming the first conductivity type AlGaN shells comprises forming substantially single crystal AlGaN shell portions extending over and around the respective semiconductor nanowire cores and first conductivity type polycrystalline AlGaN foot portions which extend on the insulating masking layer in the spaces between the second conductivity type semiconductor shells; and
the step of forming the first electrode layer comprises forming a continuous first electrode layer on the exposed tips and the at least upper portions of the sidewalls of the second conductivity type semiconductor shells and on the insulating layer in the spaces between the second conductivity type semiconductor shells such that the first electrode layer does not contact the polycrystalline AlGaN foot portions; and
the first conductivity type polycrystalline AlGaN foot portions connect to the respective first conductivity type AlGaN shells under the respective second conductivity type semiconductor shells and under the respective active region shells.

15. The method of claim 11, wherein the insulating layer comprises a spin-on glass layer having a curved upper surface.

16. The method of claim 15, further comprising forming an active region shell around each of the plurality of first conductivity type semiconductor nanowire cores, wherein the device comprises a light emitting diode (LED) device.

17. The method of claim 16, wherein the first conductivity type comprises n-type, the second conductivity type comprises p-type and the first electrode layer comprises a p-electrode layer.

18. The method of claim 17, further comprising a second electrode layer which electrically connects to the n-type semiconductor nanowire cores.

19. The method of claim 18, wherein the support comprises an n-type semiconductor buffer layer on a substrate, the buffer layer comprises an n-GaN or n-AlGaN layer, the semiconductor nanowire cores comprise n-GaN nanowires, the at least active region shell comprises an InGaN/GaN quantum well and the first electrode layer comprises a transparent conductive oxide (TCO).

* * * * *